United States Patent [19]

Orban

[11] Patent Number: 4,933,994
[45] Date of Patent: Jun. 19, 1990

[54] METHOD FOR FABRICATING A SELF-ALIGNED LIGHTLY DOPED DRAIN SEMICONDUCTOR DEVICE WITH SILICIDE

[75] Inventor: Richard A. Orban, Raleigh, N.C.

[73] Assignee: General Electric Company, Raleigh, N.C.

[21] Appl. No.: 243,200

[22] Filed: Sep. 8, 1988

Related U.S. Application Data

[63] Continuation of Ser. No. 60,491, Jun. 11, 1987, abandoned.

[51] Int. Cl.[5] .................. H01L 21/265; H01L 21/70
[52] U.S. Cl. ........................................ 437/44; 437/27; 437/34; 437/41; 437/57; 437/192; 437/200; 437/201; 357/23.3; 357/42; 357/44
[58] Field of Search ............ 437/34, 40, 41, 27, 437/57, 58, 44, 189, 192, 193, 196, 200, 201, 233, 245, 913, 934, 946, 951; 357/23.3, 42, 44, 91; 156/643, 646, 650, 651, 652

[56] References Cited

U.S. PATENT DOCUMENTS

| | | | |
|---|---|---|---|
| 4,198,250 | 4/1980 | Jecmen | 437/44 |
| 4,329,706 | 5/1982 | Crowder et al. | 437/200 |
| 4,389,257 | 6/1983 | Geipel, Jr. et al. | 437/200 |
| 4,450,620 | 5/1984 | Fuls et al. | 437/200 |
| 4,458,410 | 7/1984 | Sugaki et al. | 437/200 |
| 4,510,670 | 4/1985 | Schwabe et al. | 437/200 |
| 4,530,150 | 7/1985 | Shirato et al. | 437/44 |
| 4,536,944 | 8/1985 | Bracco et al. | 437/44 |
| 4,577,391 | 3/1986 | Hsia et al. | 437/44 |
| 4,577,392 | 3/1986 | Peterson | 437/200 |
| 4,587,718 | 5/1986 | Haken et al. | 437/200 |
| 4,597,163 | 7/1986 | Tsang | 437/200 |
| 4,612,258 | 9/1986 | Tsang | 437/200 |
| 4,640,844 | 2/1987 | Neppl et al. | 437/200 |

FOREIGN PATENT DOCUMENTS

| | | |
|---|---|---|
| 3527098 | 1/1987 | Fed. Rep. of Germany . |
| 61-65426 | 4/1986 | Japan . |
| 2159662 | 12/1985 | United Kingdom . |

OTHER PUBLICATIONS

Anonymous, "Underlayer for Polycide Process", IBM Technical Disclosure Bulletin, vol. 28, No. 9, Feb. 1986, pp. 3968–3969.
Iyer et al., "New Salicide Spacer Technology", IBM Technical Disclosure Bulletin, vol. 27, No. 3, Aug. 1984, pp. 1801–1802.
Shibata et al., "An Optimally Designated Process for Submicron MOSFETs", IEDM, 1981, pp. 647–650.
Murarka, "Refractory Silicides for Integrated Circuits", J. Vac. Sci. Technol., vol. 17, No. 4, Jul./Aug. 1980, pp. 775–792.
Murarka, *Silicides for VLSI Applications*, Academic Press, Inc., 1983, pp. 152–156.

(List continued on next page.)

Primary Examiner—Brian E. Hearn
Assistant Examiner—M. Wilczewski
Attorney, Agent, or Firm—K. R. Glick

[57] ABSTRACT

A method for using a self-aligned metallic mask for formation of a shallow source/drain, lightly doped drain metal-oxide-semiconductor device having a self-aligned low-resistivity silicide/polysilicon gate for greater device speed. The invention involves coating a semiconductor wafer in an intermediate stage of processing with a refractory metal layer over a polysilicon layer. The refractory metal layer is patterned and etched to expose corresponding portions of the underlying polysilicon layer, and then the wafer is preamorphized. After appropriate doping of N+ and P+ regions, the semiconductor wafer is subjected to an annealing process, which sinters the metal layer with the underlying polysilicon layer to form a silicide. The silicide provides a low resistivity path for the transistor structures, resulting in greater device speed. Use of the self-aligned metallic mask permits the fabrication of lightly doped drain semiconductor devices having shallow source and drain regions.

6 Claims, 4 Drawing Sheets

OTHER PUBLICATIONS

Wolf et al., *Silicon Processing for the VLSI Era, vol. 1: Process Technology,* Lattice Press, 1986, pp. 388–391.

Ghandhi, *VLSI Fabrication Principles,* John Wiley and Sons, Inc., 1983, pp. 351, 358–362.

Ghandhi, *VLSI Fabrication Principles,* John Wiley and Sons, Inc., 1983, pp. 435–437 and 323–325.

Alperin et al., "Development of the Self-Aligned Titanium Silicide Process for VLSI Applications," IEEE J. of Solid State Circuits, vol. SC-20, No. 1, Feb. 1985, pp. 61–69.

Jones et al., "Salicide with Buried Silicide Layer," IBM Technical Disclosure Bulletin, vol. 27, No. 2, Jul. 1984, pp. 1044–1045.

Chow et al., "Refractory $MoSi_2$ and $MoSi_2$/Polysilicon Bulk CMOS Circuits", IEEE Electron Device Letters, vol. EDL-3, No. 2, Feb. 1982, pp. 37–40.

METHOD FOR FABRICATING A SELF-ALIGNED LIGHTLY DOPED DRAIN SEMICONDUCTOR DEVICE WITH SILICIDE

This is a continuation of application Ser. No. 060,491, filed June 11, 1987 now abandoned.

BACKGROUND OF THE INVENTION

1. Field of the Invention

The invention relates to a method for using a self-aligned metallic mask for formation of a metal-oxide-semiconductor device, and more particularly a method for forming a shallow source/drain, lightly doped drain metal-oxide-semiconductor device having a self-aligned low-resistivity silicide/polysilicon gate for greater device speed.

2. Related Art

In the manufacture of semiconductor products, it is always highly desirable to reduce the number of masking levels in order to increase yield. It is also desirable to use metallic masks where possible during process steps because a non-metallic mask is erodible and pattern definitions on a semiconductor wafer are less sharp than the patterns formed using a metallic mask. Further, it is desirable to fabricate metal-oxide-semiconductor devices having shallow source and drain regions because their transistor electrical characteristics are more easily controlled in fine-line geometry devices. Furthermore, it is desirable to manufacture such devices with lightly doped source and drain regions (although both regions are lightly doped, such devices are commonly referred to as "lightly doped drain", or "LDD" devices) to prevent "hot electron" effects by reducing the electric field path to slow down electrons.

The present invention provides a means for fabricating shallow source/drain LDD semiconductor devices using a self-aligned metallic mask. In the process of providing such a self-aligned metallic mask, a self-aligned silicide is formed on the gates of each transistor structure. The silicide provides a low resistivity path, resulting in greater device speed.

SUMMARY OF THE INVENTION

The present invention involves coating a semiconductor wafer in an intermediate stage of processing with a refractory metal layer over a polysilicon layer. The refractory metal layer is patterned and etched in known fashion to expose corresponding portions of the underlying polysilicon layer. After appropriate doping of N+ and P+ regions, the semiconductor wafer is subjected to an annealing process, which, among other things, sinters the metal layer with the underlying polysilicon layer to form a silicide. The silicide provides a low resistivity path for the transistor structures, resulting in greater device speed.

Use of the self-aligned metallic mask permits the fabrication of lightly doped drain semiconductor devices having shallow source and drain regions.

DESCRIPTION OF THE DRAWINGS

Like reference numbers in the various drawings refer to like elements.

DETAILED DESCRIPTION OF THE INVENTION

The illustrated embodiment of the invention shows a method of fabricating a pair of complementary metal-oxide-semiconductor (CMOS) transistor device structures. However, the inventive concepts taught herein also apply to the fabrication of N-channel (NMOS) and P-channel (PMOS) metal-oxide-semiconductor transistor device structures.

Figure 1:
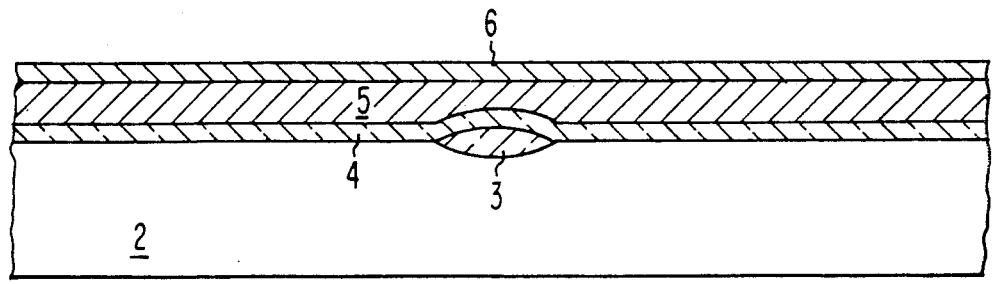
FIG. 1 is a diagrammatic cross-section of a first intermediate stage of manufacture of an integrated circuit fabricated in conformance with the present invention.

FIG. 1 shows a diagrammatic cross section of a semiconductor wafer 1, initially comprising only a substrate 2 (silicon in the present example), that is in an intermediate stage of processing. In previous steps (not shown), a field oxide layer 3 is grown and patterned in known fashion on the silicon substrate 2. Thereafter, the wafer 1 is coated in known fashion with a gate oxide layer 4, which is in turn coated in known fashion with a polysilicon layer 5. A refractory metal layer 6 is then deposited in known fashion (e.g., sputtering) on top of the polysilicon layer 5. The refractory metal may be, for example, titanium, tungsten, or molybdenum.

Figure 2:
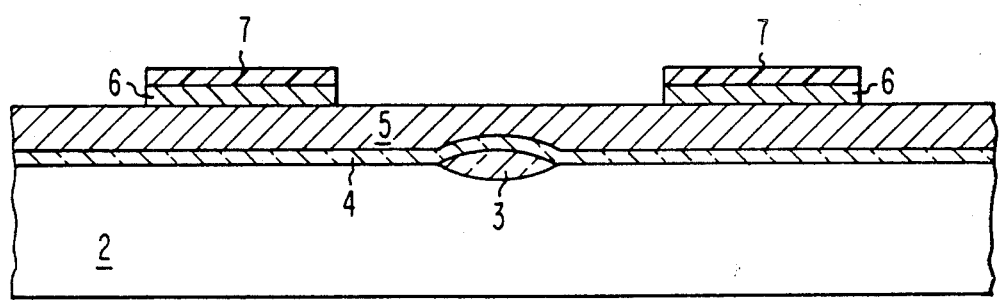
FIG. 2 is a diagrammatic cross-section of a second intermediate stage of an integrated circuit fabricated in conformance with the present invention.

FIG. 2 shows a next intermediate stage of processing, in which the refractory metal layer has been coated in a known fashion with a photoresist layer 7, which is then patterned in known fashion. Exposed portions of the metal layer 6 are then etched in known fashion to expose corresponding portions of the underlying polysilicon layer 5.

Figure 3:
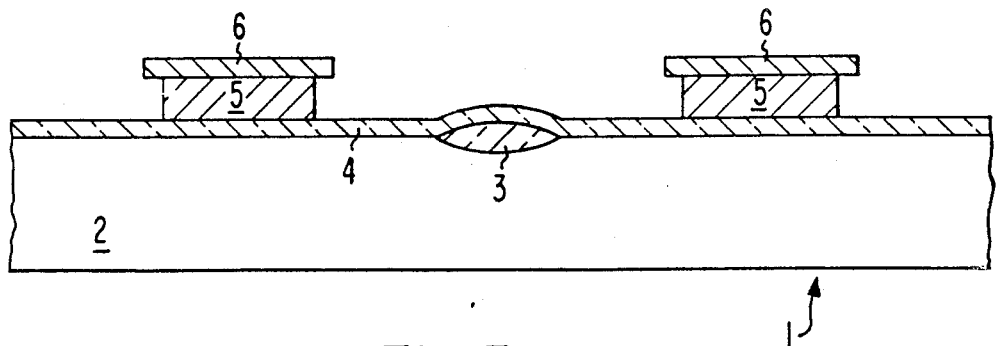
FIG. 3 is a diagrammatic cross-section of a third intermediate stage of an integrated circuit fabricated in conformance with the present invention.
Figure 4:
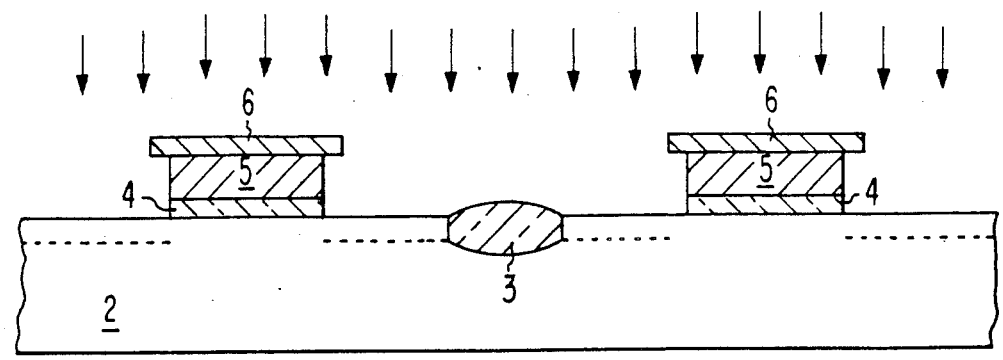
FIG. 4 is a diagrammatic cross-section of a fourth intermediate stage of an integrated circuit fabricated in conformance with the present invention.

FIG. 3 shows a next intermediate stage of processing, wherein the photoresist layer 7 of FIG. 4 has been stripped in known fashion, and the exposed portions of the polysilicon layer 5 not covered by the patterned metal layer 6 are etched in known manner. The patterned metal layer 6 serves as a thin mask layer protecting the underlying polysilicon layer 5 portions. Typically, the polysilicon layer may be undercut 15 from the margin 14 of metal Layer 6 by approximately 0.1 to 0.15 microns on each side of the metal over-layer.

FIG. 4 shows a next intermediate stage of processing, in which the gate oxide layer 4 is etched in known manner, exposing the surface of the substrate 2 except where covered by the combination of the oxide-polysilicon-metal layers. The wafer 1 is then implanted with atoms at indicated by the dash line (typically silicon or argon) to preamorphize the exposed silicon substrate 2 as indicated by the dash lines. The purpose of the preamorphization is to prevent uncontrolled channeling of subsequent dopants into the crystalline silicon substrate structure, by intentionally changing the surface of the silicon into an amorphous phase.

Figure 5:
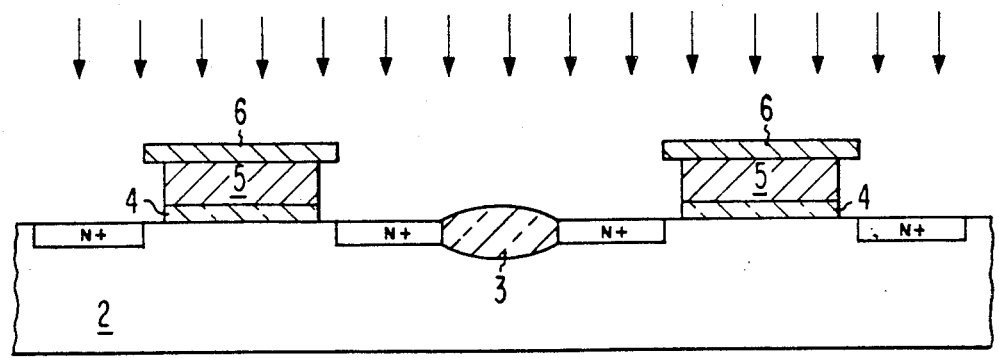
FIG. 5 is a diagrammatic cross-section of a fifth intermediate stage of an integrated circuit fabricated in conformance with the present invention.

After the implant of silicon atoms, the wafer 1 is subjected to implantation of a doping material (in the illustrated embodiment, arsenic), at as indicated by the arrows in FIG. 5 a dosage of approximately $1 \times 10^{14}$ to $5 \times 10^{15}$ ions/cm$^2$, as a blanket implant over the entire exposed substrate 2 surface, thereby forming N+ regions on the substrate surface.

Figure 6:
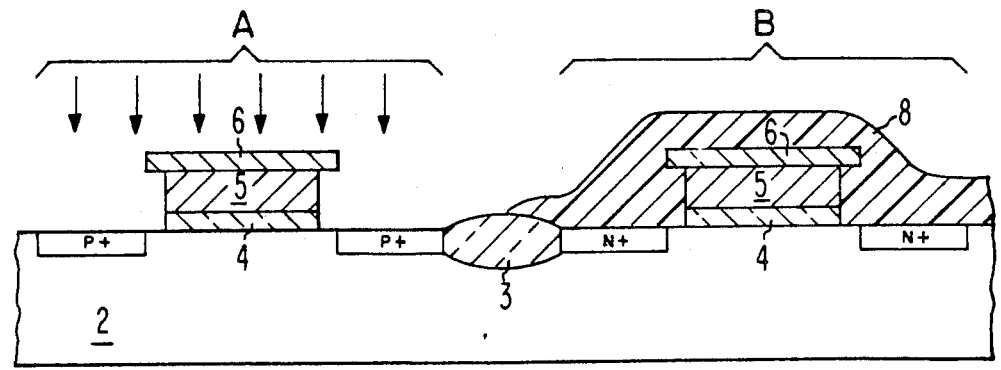
FIG. 6 is a diagrammatic cross-section of a sixth intermediate stage of an integrated circuit fabricated in conformance with the present invention.

FIG. 6 shows a next intermediate stage of the inventive process, showing two adjacent structures, A and B, covered by remaining portions of the metal layer 6, that will serve to form a pair of complementary metal-oxide-semiconductor transistor structures. In FIG. 6, the wafer 1 is covered with a photoresist layer 8, which is then patterned in known fashion to define what will become active area regions separated at the surface of the wafer 1 from the previously formed N+ active area regions by the previously-grown field oxide 3.

The wafer 1 is subjected to an implantation of a doping material (such as boron) as indicated by the arrows at a dosage twice that of the previous arsenic implant (i.e., about $5 \times 10^{15}$ ions/cm$^2$), which counter-dopes the exposed silicon substrate 2. This causes the source and drain regions around the A structure to have a P+ doping, while the resist-protected source and drain regions around the B structure remain with an N+ doping.

Figure 7:
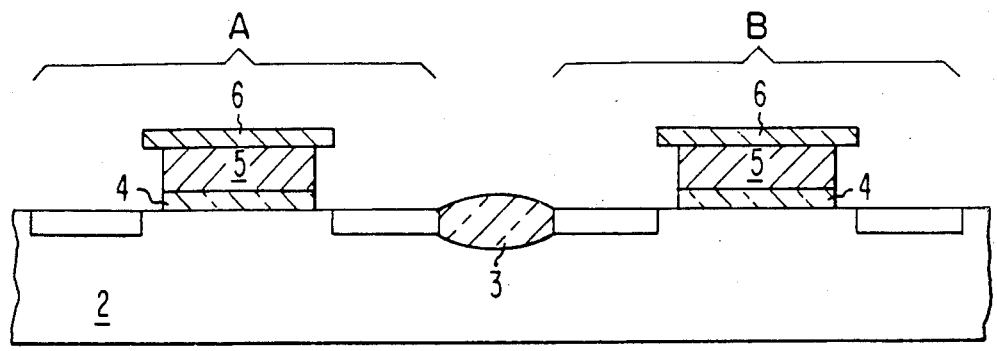
FIG. 7 is a diagrammatic cross-section of a seventh intermediate stage of an integrated circuit fabricated in conformance with the present invention.
Figure 8:
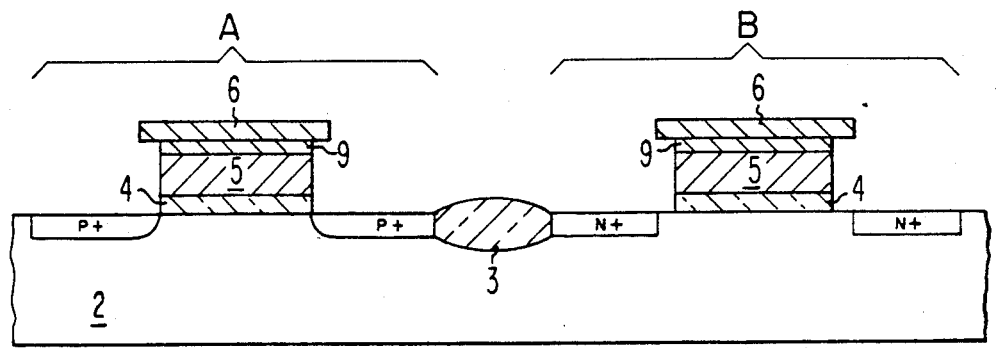
FIG. 8 is a diagrammatic cross-section of an eighth intermediate stage of an integrated circuit fabricated in conformance with the present invention.

FIG. 7 shows the next intermediate stage of processing, in which the photoresist layer of FIG. 6 has been stripped away. The wafer 1 is then subjected to an annealing process, which anneals the source/drain implants, changing the amorphous-phase silicon surface back into its crystalline phase. The annealing process also sinters the metal layer 6 with the underlying polysilicon layer 5 to form a silicide layer 9, as shown in FIG. 8. The annealing step in the preferred embodiment may take place at a temperature in the range of about 600 to 1100 degrees Celsius, which diffuses the boron implant but not the arsenic implant. The diffusion of the boron implant drives the P+ source and drain regions of the A structure laterally towards the edge of the gate oxide 4, as shown in FIG. 8.

Figure 9:
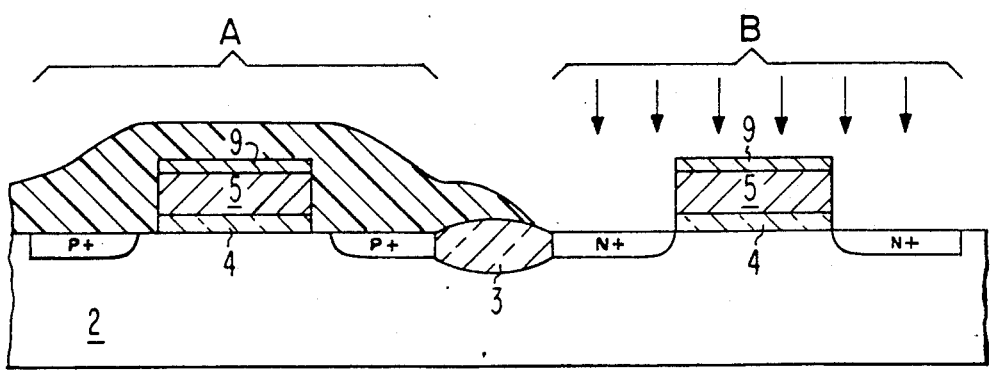
FIG. 9 is a diagrammatic cross-section of a ninth intermediate stage of an integrated circuit fabricated in conformance with the present invention.
Figure 10:
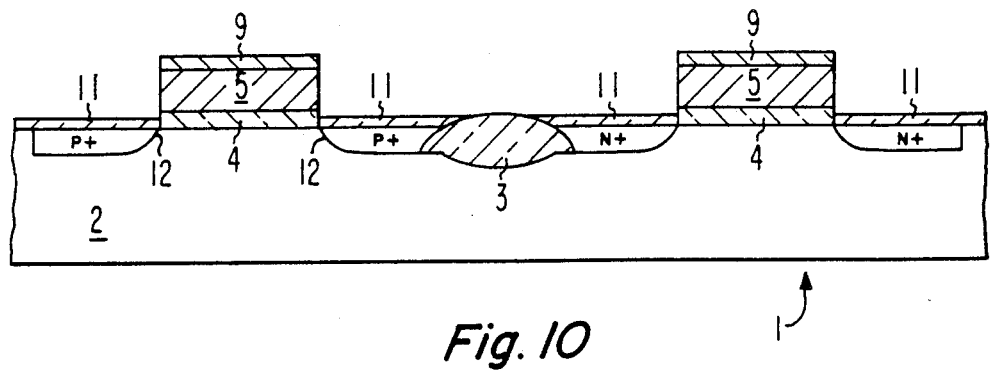
FIG. 10 is a diagrammatic cross-section of a tenth intermediate stage of an integrated circuit fabricated in conformance with the present invention.

FIG. 9 shows the next intermediate stage of processing, in which the remaining unreacted metal layer 6 is etched away, exposing the underlying metal silicide layer 9. The entire wafer 1 is coated with a photoresist layer 10, which is patterned in known manner, as shown in FIG. 9, to define and open the N+ source and drain regions of the B structure. The wafer is then subjected to an implantation step of a light dose of N− type doping material (phosphorous or arsenic, at a dosage of approximately $1 \times 10^{12}$ to $1 \times 10^{14}$ ions/cm$^2$). This forms a lightly doped source/drain device with respect to the B structure by extending a portion 20 of shallow N+ regions adjacent to the gate oxide 6 of the B structure (as shown in FIG. 9).

FIG. 9 shows a next intermediate stage of processing, in which the photoresist layer 10 of FIG. 8 has been stripped. The wafer 1 is then subjected to an oxidation-/annealing step in known fashion (at about 900 degrees Celsius), thereby forming a thin oxide layer 11 over the previously exposed P+ and N+ source and drain regions. The oxide layer is typically 50 to 200 Angstroms thick. This step also serves to cause a diffusion of P+ doping material to the edge of the gate region 12 of the A transistor structure.

The resulting structure is a pair of complementary metal-oxide semiconductor transistor structures having a shallow source/drain lightly doped drain structure with a low-resistivity silicide/polysilicon gate, formed with fewer and more precise masking steps than in the prior art.

As an alternative method for fabricating the complementary metal-oxide semiconductor transistors shown in the figures, basically the same functionality of the ultimate devices can be achieved by annealing the source and drain implants in FIG. 7 until the boron implants in the P+ region of the A structure diffuse to and past the polysilicon layer 5 gate edge. Processing would continue partly as shown in FIG. 8, where the unreacted metal layer 4 would be removed, exposing the metal silicide layer 8 formed during the annealing process. Processing would continue basically as shown in FIG. 8, except that the photoresist layer 10 would not be used, and the light dose of phosphorus or arsenic would be applied to the entire wafer 1. Processing would continue as shown in FIG. 9, except that there would be no need to strip the photoresist layer 10.

Further processing steps may be required to fully form active transistors from the A and B structures shown in FIG. 9. Such steps may, for example, comprise formation of electrical contacts to the source and drain regions of the two structures. Such steps are well known in the prior art.

Other embodiments of the inventive concept would be obvious to one skilled in the art. Thus, as noted before, different materials having similar characteristics may be substituted for the materials identified in the illustrated embodiment. For example, various doping processes well-known in the art may be applied as desired at appropriate times in the manufacturing process. Therefore, the scope of the invention is not limited to the present disclosure, but by the scope of the following claims.

I claim:

1. A method for fabricating at least a pair of shallow source/drain, light doped drain complementary metal-oxide-semiconductor devices having self-aligned low-resistivity silicide/polysilicon gates, comprising at least the sequential steps of:
   (a) providing a silicon substrate having field oxide regions grown thereon in a predetermined pattern and defining a first device type area and a second device type area;
   (b) depositing a gate oxide layer over the substrate;
   (c) depositing a polysilicon layer over the gate oxide layer;
   (d) depositing a refractory metal layer over the polysilicon layer;
   (e) selectively removing portions of the refractory metal layer in a desired pattern to define a gate region in each first device type area and in each second device type area;
   (f) selectively removing the polysilicon layer in the pattern defined by the patterned refractory metal layer, thereby exposing at least the field oxide regions and further so that the polysilicon is undercut with respect to the sides of the patterned refractory meal layer;

(g) selectively removing the gate oxide layer in the pattern defined by the patterned refractory metal-polysilicon-oxide layer, thereby exposing surface regions of the substrates;

(h) preamorphizing the exposed surface of the substrate, thereby limiting the implant depth of dopants in subsequent steps;

(i) implanting dopants in a first conductivity type into the exposed surface regions of the substrate, thereby forming source and drain regions which extend approximately to the sides of the patterned refractory metal layer of the gate region in each first device type area but spaced from the underlying polysilicon layer;

(j) implanting dopants of a second conductivity type in selected areas of the exposed surface regions of the substrate, thereby forming source and drain regions which extend approximately to the sides of the patterned refractory metal layer of the gate region in each second device type area but spaced from the underlying polysilicon layer;

(k) annealing the substrate at a temperature sufficient to react the patterned refractory metal layer and the underlying polysilicon layer to form a silicide layer therebetween, and diffusing the source and drain regions formed of dopants of said second type to the edge of the adjacent gate region;

(l) removing any unreacted refractory metal from the polysilicon gate region; and (m) implanting dopants of the first type in selected areas of the exposed surface regions of the substrate, thereby forming shallow doping regions between (1) the source and drain regions approximate but spaced from the gate region in each first device type area and (2) the edge of the adjacent gate region.

2. The method of claim 1, including the further step of forming an oxide layer over the source and drain regions.

3. A method for fabricating a shallow source/drain, lightly doped drain metal-oxide-semiconductor device having a self-aligned low-resistance silicide/polysilicon gate, comprising at least the sequential steps of:

(a) providing a silicon substrate;

(b) forming at least one gate region on the substrate of a layer of gate oxide on the substrate, a layer of polysilicon over the gate oxide and a refractory metal layer over the polysilicon layer with the polysilicon being undercut with respect to the sides of the refractory metal layer;

(c) implanting dopants of a first conductivity type in selected areas of the surface regions of the substrate on each side of each gate region approximately to the sides of the refractory metal layer of each gate region but spaced from the underlying polysilicon layer;

(d) annealing the substrate at a temperature sufficient to react the refractory metal layer and the underlying polysilicon layer to form a silicide layer therebetween;

(e) removing any unreacted refractory metal from the polysilicon gate region; and (f) implanting dopants of the first type in the surface regions of the substrate on each side of each gate region, thereby forming shallow doping regions between (1) the source and drain regions and (2) the edge of the adjacent gate region.

4. The method of claim 3 wherein the gate region is formed by:

(a) depositing a gate oxide layer over the substrate;

(b) depositing a polysilicon layer over the gate oxide layer;

(c) depositing a refractory metal layer over the polysilicon layer;

(d) selectively removing portions of the refractory metal layer in a desired pattern to form the gate region; and (e) selectively removing the polysilicon layer in the pattern defined by the patterned refractory metal layer so that the polysilicon is undercut with respect to the sides of the patterned refractory metal layer.

5. The method of claim 4 wherein after removing the polysilicon layer, the step of selectively removing the gate oxide layer in the pattern defined by the patterned refractory-metal-polysilicon-oxide layer, thereby exposing surface regions of the substrate.

6. The method of claim 5 wherein before implanting dopants of the first conductivity type into the substrate the step of preamorphizing the exposed surface of the substrate, thereby limiting the implant depth of dopants into the substrate.

* * * * *